(12) United States Patent
Patti et al.

(10) Patent No.: US 8,715,915 B2
(45) Date of Patent: May 6, 2014

(54) HIGH-RESOLUTION PHOTOLITHOGRAPHIC METHOD FOR FORMING NANOSTRUCTURES, IN PARTICULAR IN THE MANUFACTURE OF INTEGRATED ELECTRONIC DEVICES

(75) Inventors: Davide Giuseppe Patti, Mascalucia (IT); Daria Puccia, Catania (IT)

(73) Assignee: STMicroelectronics S.r.l., Agrate Brianza (MB) (IT)

( * ) Notice: Subject to any disclaimer, the term of this patent is extended or adjusted under 35 U.S.C. 154(b) by 87 days.

(21) Appl. No.: 13/047,320

(22) Filed: Mar. 14, 2011

(65) Prior Publication Data
US 2011/0287363 A1 Nov. 24, 2011

(30) Foreign Application Priority Data
Mar. 15, 2010 (IT) .............. TO2010A0193

(51) Int. Cl.
G03F 7/26 (2006.01)
(52) U.S. Cl.
USPC .......................................... 430/323; 430/313
(58) Field of Classification Search
USPC ................................. 430/311, 322
See application file for complete search history.

(56) References Cited

U.S. PATENT DOCUMENTS

2004/0101634 A1* 5/2004 Park et al. ............ 427/558
2005/0233263 A1 10/2005 Part et al.
2007/0164430 A1* 7/2007 Lin et al. ............. 257/734
2008/0194073 A1 8/2008 Park
2008/0203380 A1 8/2008 Wang et al.
2009/0035209 A1* 2/2009 Kondo et al. ............ 423/447.1

FOREIGN PATENT DOCUMENTS

EP 1422563 A1 5/2004
JP 2007156111 A 6/2007

OTHER PUBLICATIONS

Italian Search Report and Written Opinion dated Oct. 13, 2010 from corresponding Italian Application No. TO20100193.

\* cited by examiner

*Primary Examiner* — Kathleen Duda
(74) *Attorney, Agent, or Firm* — Wolf, Greenfield & Sacks, P.C.

(57) ABSTRACT

A photolithographic process, wherein a photosensitive layer is formed on a surface of a body to be defined; the photosensitive layer is exposed through a photolithographic mask having zones with lower transparency and zones with higher transparency so as to obtain exposed portions and shielded portions of the photosensitive layer; selective portions of the photosensitive layer chosen between the exposed portions and the shielded portions of the photosensitive layer are removed; and portions of the body under the selective portions of the photosensitive layer are selectively removed. The composite layer includes photoresist and carbon nanotubes, which are embedded in the photoresist and extend in a direction generally transverse to, and in electrical contact with, the body.

18 Claims, 5 Drawing Sheets

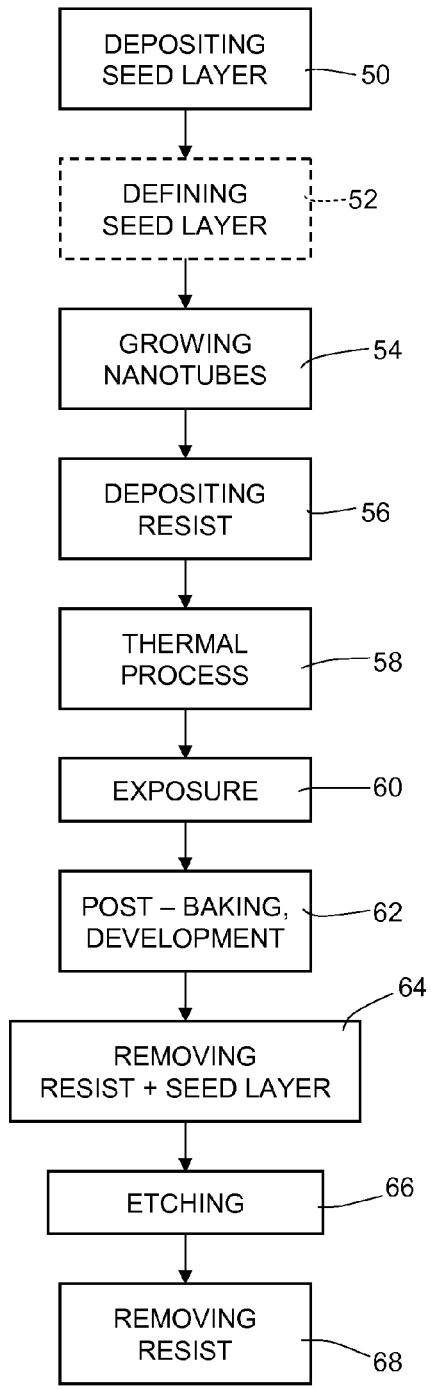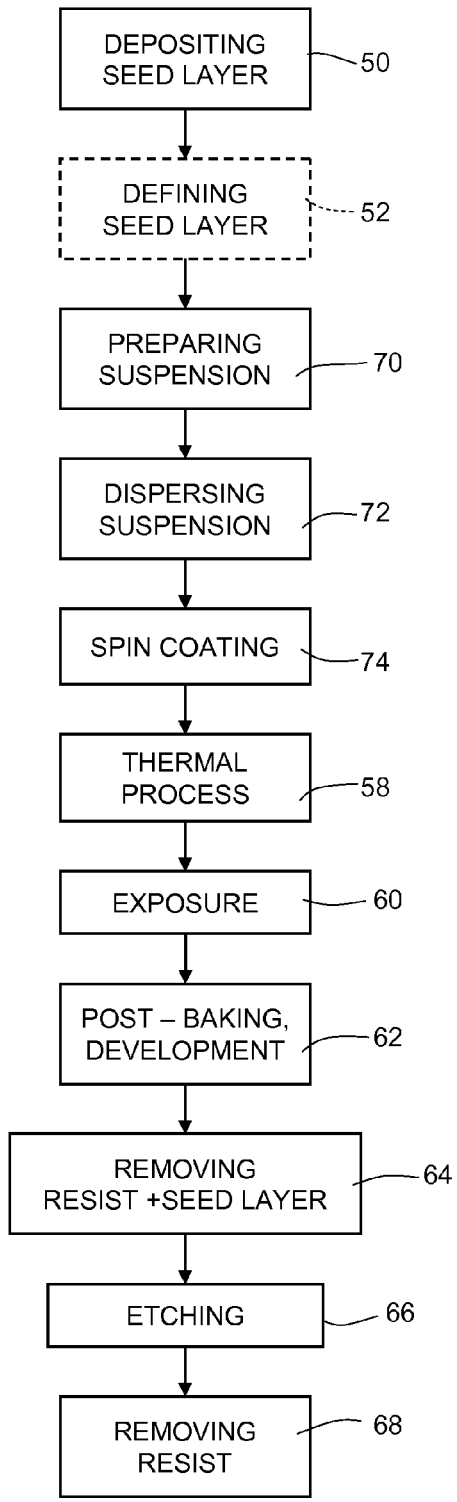
Fig.3
Fig.12

HIGH-RESOLUTION PHOTOLITHOGRAPHIC METHOD FOR FORMING NANOSTRUCTURES, IN PARTICULAR IN THE MANUFACTURE OF INTEGRATED ELECTRONIC DEVICES

CROSS REFERENCE TO RELATED APPLICATIONS

This application claims the priority benefit of Italian patent application number TO2010A000193, filed on Mar. 15, 2010, entitled "High-Resolution Photolithographic Method for Forming Nanostructures, in Particular in the Manufacture of Integrated Electronic Devices," which is hereby incorporated by reference to the maximum extent allowable by law.

BACKGROUND OF THE INVENTION

1. Field of Invention

The present invention relates to a high-resolution photolithographic method for forming nanostructures, in particular in the manufacture of integrated electronic devices.

2. Discussion of the Related Art

In the manufacture of semiconductor integrated devices, the need to reduce the overall dimensions of the devices is continuously felt. To this end, the electronic industry is seeking solutions that enable improvement of the photolithographic process, which considerably affects these dimensions.

As is known, lithography is a process that enables transfer of a configuration or "pattern" from a mask to a thin layer of material sensitive to radiation (referred to as "resist" or "photoresist"), which coats a body to be patterned, for example a silicon substrate.

In particular, lithography exploits the capacity of the resist to change its chemical and/or physical properties when exposed to radiation and thus to be selectively removable where it is exposed or not exposed.

To this end, as shown in FIG. 1, a substrate 1 is coated with a resist layer 2; then the resist layer 2 is heated at moderate temperatures (soft bake, SB) to cause evaporation of the residual solvent and improve adhesion between the resist and the substrate, and is exposed to the radiation 5 generated by a light source 3 through a mask 4 previously provided and including zones transparent to radiation and opaque zones, corresponding to the pattern that is to be transferred. After exposure, the resist layer is, in general, baked (post-exposure bake, PEB) on a hot-plate or in an oven. This treatment has multiple functions that depend upon the nature of the resist used.

The resist layer exposed to light hardens (polymerization phenomenon) and withstands subsequent washing with solvents or acids. At this point the wafer is immersed in a solution that develops the pattern transferred to the photosensitive material by exploiting the variations of solubility generated by radiation. According to the type of polymer used, the exposed zones (positive resist) or the non-exposed zones (negative resist) can be removed.

Positive photoresists include of some components listed below:
1. Polymeric resin with molecular weight in the region of 1-10 kDa;
2. Photoactive organic molecules (PACs);
3. Levelling agents (SLAB), which prevent formation of undulations on the surface of the resist during spinning;
4. Optional colorants for reducing the effects due to reflectivity of the substrate (standing waves);
5. Spinnable solvent or mixture of solvents.

Since the two most important components are resin and PAC, these resists are, in general, referred to as "two-component resists".

The polymeric resin most commonly used in the formulation of positive photoresists is the novolac resin, obtained from condensation of cresol with formaldehyde via acid catalysis (see FIG. 2 for the chemical formula of novolac).

Positive resins are soluble in basic aqueous solutions, and their dissolving rate depends upon their molecular weight and the relative proportions of the ortho, meta, and para isomers. The photoactive organic compounds added to the formulation of the resist act as inhibitors of dissolution of the resin in a basic environment.

Negative photoresists are two-component resists like positive photoresists. The operating mechanism of the resist is in any case different. In this case, the photoactive species is a photoreticulating diatide of generic formula $N_3$—X—$N_3$, where X is an aromatic group. The diatide effectively absorbs visible light and forms an extremely reactive nitrene, N—, which is able to introduce itself into the C—H and C=C bonds of the rubber resin in the resist, bringing about a cross-linking between the resin molecules. The cross-linking determines a considerable increase in the molecular weight, with consequent decrease of the solubility of the resist in the zones exposed.

The patterned resist layer is then used as a mask for the subsequent etching process, which enables selective removal of the zones of the film not protected by the resist, thus obtaining transfer of the pattern. The resist layer is finally removed, and the entire process is repeated when it is desired to produce multilevel devices.

The generation of increasingly smaller etched structures has required progressively shorter wavelengths. However, current lithographic techniques are by now reaching the limit. By using light in the deep-ultraviolet (DUV, approximately 248 nm) range it has been possible to obtain etched features of between 150 nm (0.15 μm) and 120 nm (0.12 μm) at most.

However, it is foreseeable that in the near future the market will require integrated devices with characteristics of 100-70 nm, which can be produced using deep-ultraviolet light with wavelengths of 193-157 nm. Beyond that point, wavelengths in the extreme-ultraviolet (EUV) range will be necessary. At these wavelengths, light is, however, absorbed instead of being transmitted by conventional refractive optical lenses that focus the image of the mask on the substrate, rendering polymerization of the photoresist impossible using current technologies.

Methods have thus been developed based upon a progressive reduction of the wavelength of the incident light, as well as upon the improvement of the corresponding materials and of the entire technological process. This research has given rise to as many technologies, among which:

extreme-ultraviolet lithography, high-power laser system (a few kilowatts), 13-nm wavelength, which enables emission of radiation in a single direction, with a high resolution of the image obtained, but which has the drawbacks of being very costly and leaving plasma detritus on the substrate;

x-ray lithography, which has a wavelength of 1 nm, is not affected as the previous method by contamination from dust or particles, but has a resolution limited to 100 nm;

electron-beam lithography, which has a resolution limited by the properties of the resist, not by the wavelength; in addition, the manufacturing process is slow with sequential writing; and ion-beam projection lithography, which has a very high resolution, and markedly reduces the manufacturing times because the process is controlled by a computer, but is, on the other hand, very costly and requires a reliable ion source.

The development of nanotechnologies on scanning-probe microscopes has enabled development of nanolithographic techniques based upon spatially selective removal of a polymer or upon local deposition/formation of molecules in the desired zones. A significant example is the so-called dip-pen nanolithography, whereby the tip of an atomic-force microscope (AFM) is covered by molecules, such as thiols, which are able to chemically react with a surface of gold forming strong covalent bonds therewith. By controlling the movement of the tip on the surface it is possible to exploit a drop of water as a channel for causing migration of the molecules from the tip to the specimen, obtaining a process similar to dip-pen writing. However, apparatuses of this type are still very costly.

In addition to the problem of miniaturization of the devices, the lithography currently in use in the electronic industry also has the problem that the light rays are reflected by the substrate, generally of silicon, and generate standing waves, as in optical lithography. In addition, scattering phenomena are present both in the resist (forward scattering) and in the substrate (back scattering), which are due to the high energy of the photons emitted by the light beam, in the case of electron-beam lithography. In these cases, proximity corrections are, in general, necessary.

In the latter case, in particular, the photons emitted by the light source, by penetrating in a certain part of the substrate, can cause avalanche generation of free electrons in the substrate by the Compton effect. This can also bring about a secondary emission of braking radiation.

The energy carried by the photons is then redistributed into the resist through the successive collisions of the photoelectrons that have been generated, determining partial exposure of zones that should have remained hidden. This effect is commonly known as "shadow effect" and its extent is a function of the electron range, i.e., of the mean distance covered by the photoelectron from its point of origin to the point where it has zero kinetic energy. The combination of the diffraction effects and of the shadow effect imposes a limit on the resolution that can be achieved with traditional lithography or more correctly on its patterning capability, understood as capacity of the used technique to reproduce a given pattern in given lighting conditions.

SUMMARY OF THE INVENTION

One aim of at least one embodiment of the present invention is to provide a photolithographic process having high resolution at lower costs than those that can be obtained at present with current x-ray or laser apparatuses.

According to one embodiment of the present invention, a high-resolution photolithographic method for forming nanostructures includes a photolithographic process, comprising the steps of forming a photosensitive layer on a surface of a body to be defined exposing the photosensitive layer through a photolithographic mask comprising lower transparency zones and higher transparency zones so as to obtain exposed portions and shielded portions of the photosensitive layer selectively removing selective portions of the photosensitive layer selected among the exposed portions and the shielded portions of the photosensitive layer selectively removing portions of the body arranged below the selective portions of the photosensitive layer, characterized in that the step of forming a photosensitive layer comprises forming a composite layer of photoresist containing a plurality of carbon nanotubes extending in a generally transverse direction to and in electric contact with the body.

According to another embodiment of the present invention, there is provided an intermediate structure of a photolithographic process including a seed layer comprising nickel extending on the surface of the body below the composite layer wherein the carbon nanotubes extend from the seed layer.

In practice, to overcome the problem of low resolution, carbon nanotubes are provided within the resist, that are aligned and ordered so as to trap the photoelectrons generated during exposure, thus eliminating the collisions that determine the shadow effect. In addition, since the dimensions of the carbon nanotubes are of the order of approximately 10 nm, a high resolution of the photolithographic process is obtained.

BRIEF DESCRIPTION OF THE DRAWINGS

For a better understanding of the present invention preferred embodiments thereof are now described, purely by way of non-limiting example, with reference to the attached drawings, wherein:

FIG. 3 is a flowchart regarding a first embodiment of the present photolithographic method;

FIG. 12 is a flowchart regarding a second embodiment of the present photolithographic method.

DETAILED DESCRIPTION OF THE DRAWINGS

Figure 1:
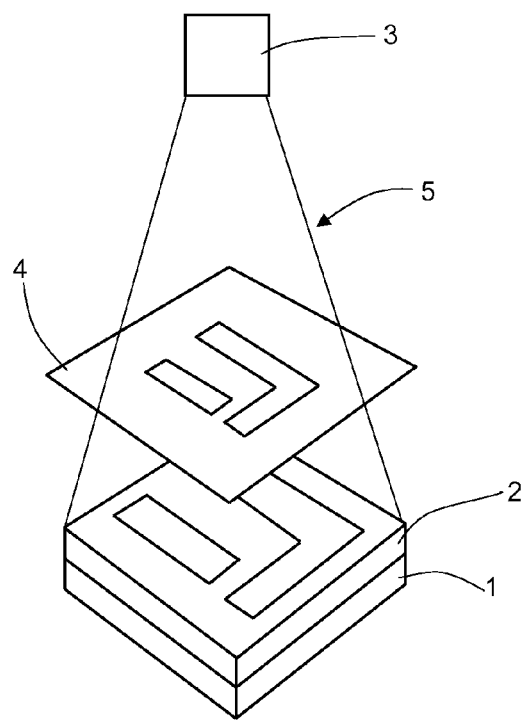
FIG. 1 shows transfer of a pattern from a mask to a resist layer in a way in a per se known manner.
Figure 2:
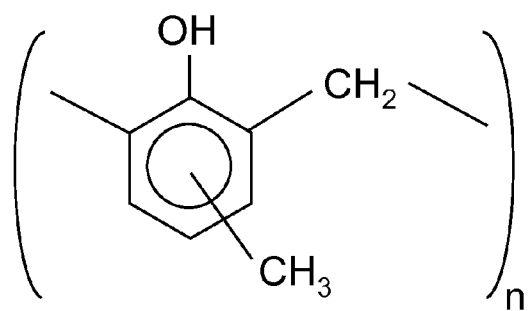
FIG. 2 shows the chemical formula of a known resin that can be used in the formulation of positive resists.
Figure 4:
FIGS. 4-10 show cross-sections through a semiconductor material wafer in successive steps of the present lithographic method.

With reference to FIGS. 3 and 4, according to a first embodiment of the present photolithographic method, a seed layer 11 is formed on a substrate 10, for example a substrate of semiconductor material, such as silicon (step 50). The substrate 10 may be made, however, of any material that can be patterned via photolithographic techniques, such as glass, metal, plastic, etc.

The seed layer 11 is of a material such as to form a seed for the subsequent vertical and orderly growth of carbon nanotubes, for example, nickel or an alloy containing nickel, has a thickness of between 2 nm and 10 nm, and is for example deposited via PECVD.

Figure 5:
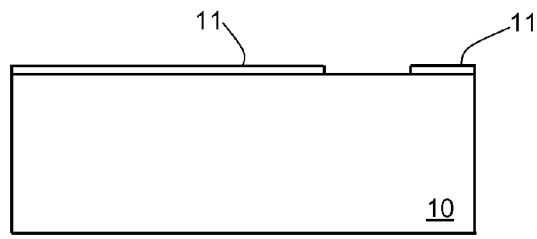

The seed layer 11 can be defined so as to be removed where it is not desired to provide the resist mask (step 52 and FIG. 5). Alternatively, the seed layer 11 is not defined. Obviously, the possible definition of the seed layer 11 occurs at a much greater scale as compared to the resolution desired for the resist mask so that the resolution that can be obtained for the seed layer 11 is irrelevant.

Figure 6:
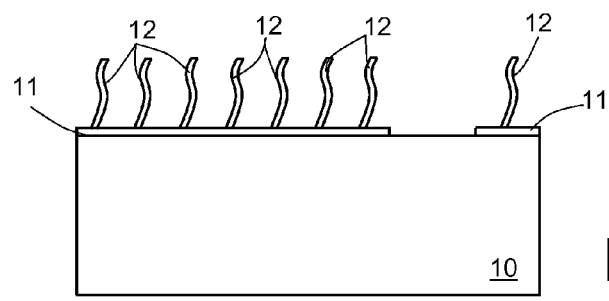

Then (step 54 and FIG. 6), using a suitable reactor, a plurality of carbon nanotubes 12 is grown. Growth can occur via chemical vapor deposition (CVD) or with electric arc, and the time of growth is chosen in so that the height of the carbon nanotubes 12 is not greater than the thickness of the resist desired layer; for example it is less than 10 µm, typically comprised between 1 and 5 µm. In this case, for example, the time of growth can be approximately two hours.

Thanks to the presence of the seed layer 11, the carbon nanotubes 12 extend in a generally vertical direction or in any case in a direction transverse to the substrate 10 starting from the seed layer 11 in an orderly way. In detail, in one embodiment, the process of growth can be the following: by applying the seed layer 11 of nickel a high temperature, for example 600-800° C., this liquefies without sublimating and forms droplets of nickel the radius of curvature whereof depends upon the thickness, here of between 2 and 10 nm, and upon the force of gravity. The nickel droplets function as a catalyst for the formation of the nanotubes 12 so that these can grow in the vertical direction, in the absence of defects in the silicon substrate 10, while the nickel droplets remain on the top of the nanotubes 12. Structures are thus formed, each having a mushroom shape, the head whereof is formed by the nickel droplet. Once growth of the nanotubes 12 has been completed, nickel can be removed by washing or in other appropriate ways.

Figure 7:
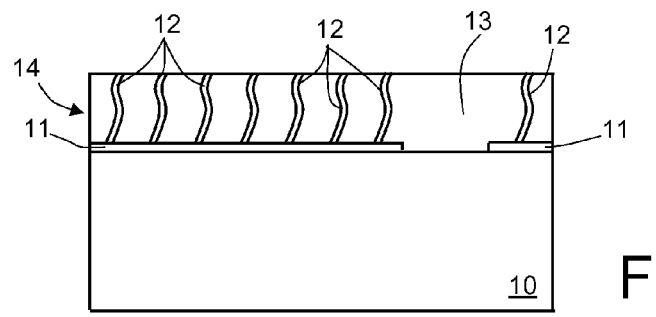

Then (step 56 and FIG. 7), photoresist 13 in liquid phase is deposited, for example a solvent containing a polymer, such as polyamide, so as to obtain a composite layer 14. In general, photoresist 13 can be made of any known material indicated above, and may be of a positive or negative type. As indicated above, the thickness of the composite layer 14 is less than 5-6 µm, typically comprised between 1 and 5 µm.

Next (step 58), a thermal process is carried out, referred to as "baking", which eliminates the solvent. According to the material of the composite layer 14, in a per se known manner, baking is carried out at 110-400° C., for example at 110-200° C., for a time comprised between 20 and 70 s, e.g., 30 and 50 s.

Figure 8:
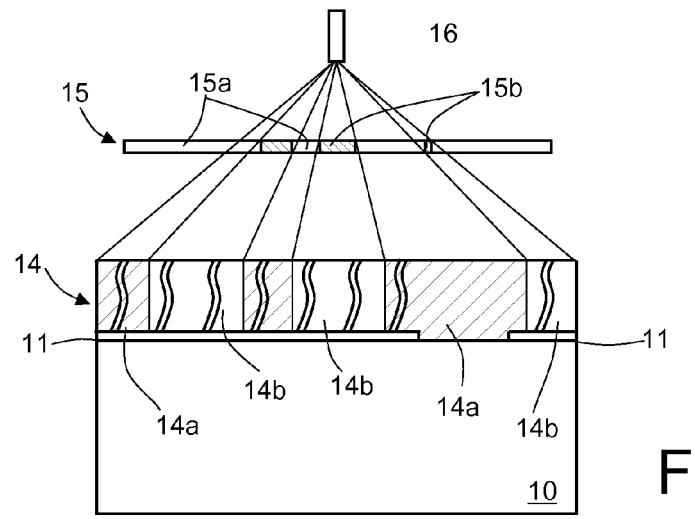
Figure 11:
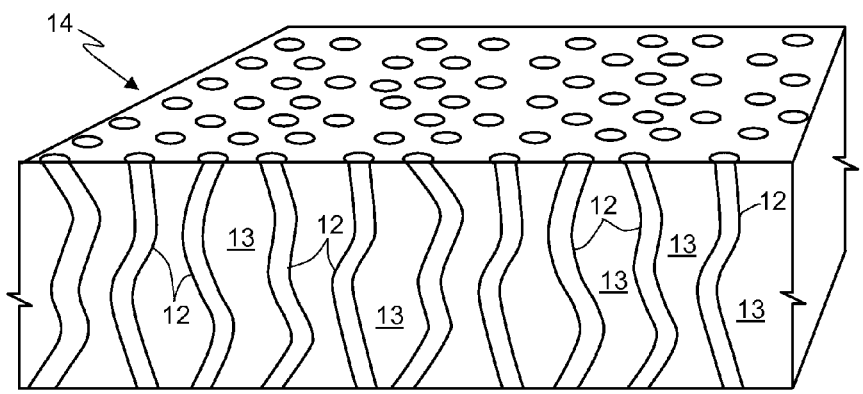
FIG. 11 shows a resist layer used in the present photolithographic method, in a three-dimensional perspective view.
Figure 13:
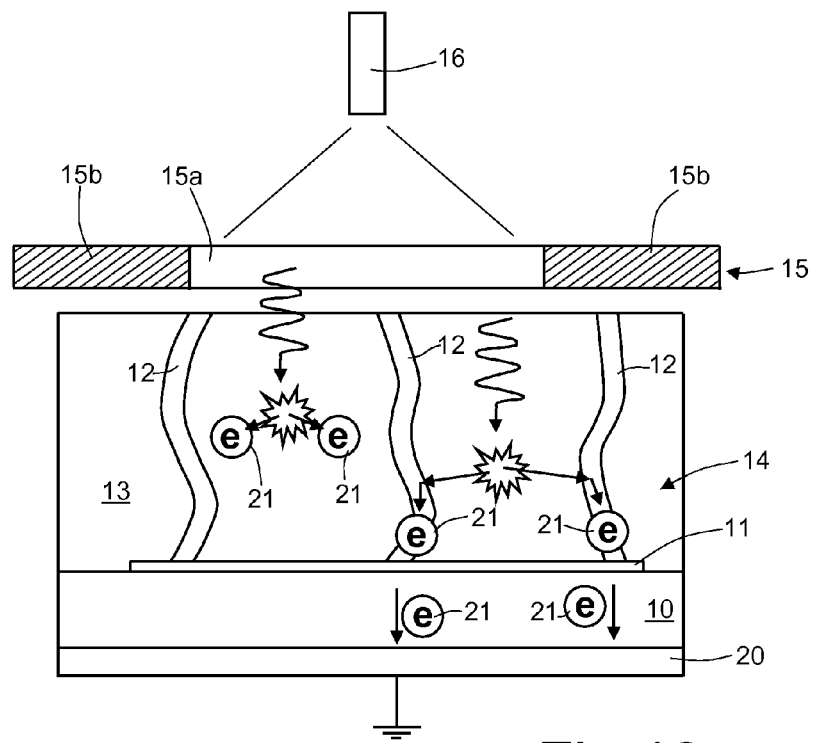
FIG. 13 shows the capture and discharge to ground of photoelectrons generated during the step of exposure of the present photolithographic method.

The composite layer 14 thus obtained (see also FIG. 11) is then exposed, using a mask 15 containing the pattern to be transferred (step 60), as shown in FIG. 8, where the used light source is designated by 16 and the mask 15 comprises transparent zones 15a and opaque zones 15b. In FIG. 8, the exposed zones of the composite layer 14 (designated by 14a) are hatched, while the zones 14b are shielded. In addition, in this step, as shown in FIG. 13, the substrate 10 is grounded or in any case biased so as to attract the photoelectrons towards the substrate 10.

Figure 9:
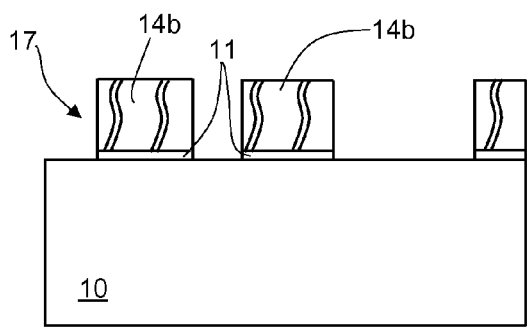

Next, the usual post-baking and development operations are carried out (step 62) so as to develop the image transferred to the photosensitive material, and (step 64) the exposed parts 14a are removed (in case of a photoresist 13 of a positive type) or the shielded parts 14b are removed (in case of a photoresist of a negative type). FIG. 9 refers to a positive-type photoresist. In this way, the surface of the substrate 10 is coated by a resist mask 17, having the transferred pattern.

Figure 10:
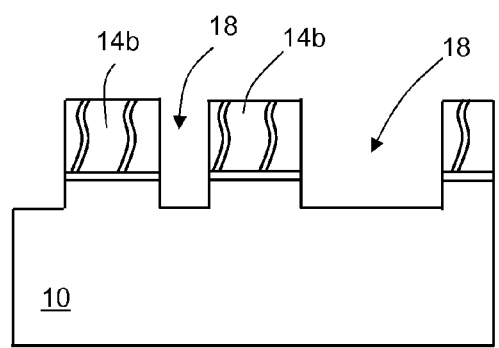

Then (step 66 and FIG. 10), the substrate 10 is chemically etched in the zones not coated by the resist mask 17, to provide cavities, trenches, or recesses 18, according to any dry-etching or wet-etching technique, in a per se known manner.

Finally, the resist mask 17 and the underlying seed layer 11 are removed, in a known manner (step 68).

According to a variant (FIG. 12), where the steps that do not differ from the method of FIG. 3 are designated by the same reference numbers, after the initial steps of deposition of the seed layer 11 (step 50) and possible definition thereof (step 52), a compound including carbon nanotubes and photoresist is prepared. A compound of this sort is described, by way of example, in US Patent Publication No. 2008/0203380 and can obtained by preparing a suspension of nanotubes (step 70) and dispersing the suspension of nanotubes in photoresist via ultrasonication (step 72). The compound thus obtained is then deposited on the substrate 10 and on the seed layer 11 by spin coating (step 74), so as to obtain the composite layer 14 of FIGS. 7 and 11.

Then the process includes the same steps described above with reference to FIG. 3, which include baking 58, exposing 60, post-baking and developing 62, selectively removing 64 the composite layer 14, chemical etching 66, and removing 68 of the resist mask 17.

In this way, as shown in FIG. 13 for a substrate 10 covered with a composite layer 14 and having a bottom metal layer 20 grounded during exposing, when the photoelectrons 21 resulting from reflection, scattering, successive collisions, or the like reach the carbon nanotubes 12, they are captured by the latter and guided, owing to the existing biasings, towards the substrate 10 and ground, where they are dispersed.

Consequently, a considerable reduction of the redistribution of the energy carried by the photons and of partial exposure of the zones not directly exposed through the mask 15 (shadow effect) is obtained. This enables a resolution of the photolithographic process to be obtained that is comparable with the size of the carbon nanotubes 12 (currently less than 10 nm) with a tolerance depending upon the mean distance between the carbon nanotubes themselves. The present photolithographic process thus has a very high resolution as compared with known processes.

Finally, it is clear that modifications and variations may be made to the photolithographic process described and illustrated herein, without thereby departing from the scope of the present invention, as defined in the annexed claims.

Having thus described at least one illustrative embodiment of the invention, various alterations, modifications, and improvements will readily occur to those skilled in the art. Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A photolithographic process, comprising the steps of:
   forming a photosensitive layer on a surface of a body to be defined;
   exposing the photosensitive layer through a photolithographic mask comprising lower transparency zones and higher transparency zones so as to obtain exposed portions and shielded portions of the photosensitive layer;
   selectively removing selective portions of the photosensitive layer selected among the exposed portions and the shielded portions of the photosensitive layer;
   selectively removing portions of the body arranged below the selective portions of the photosensitive layer,
   wherein the step of forming a photosensitive layer comprises forming a composite layer of photoresist containing a plurality of carbon nanotubes extending in a generally transverse direction to and in electric contact with the body.

2. A photolithographic process according to claim 1, wherein, before forming a photosensitive layer, a seed layer is formed on the surface of the body.

3. A photolithographic process according to claim 2, wherein the seed layer comprises nickel.

4. A photolithographic process according to claim 1, wherein the step of forming a composite layer comprises growing a plurality of carbon nanotubes on the body and depositing a photoresist layer in a liquid phase.

5. A photolithographic process according to claim 4, wherein the step of growing a plurality of carbon nanotubes is performed by chemical vapor deposition or by electric arc.

6. A photolithographic process according to claim 5, wherein the step of growing a plurality of carbon nanotubes comprises growing nanotubes with a length between 1 and 10 μm.

7. A photolithographic process according to claim 6, wherein the step of growing a plurality of carbon nanotubes comprises growing nanotubes with a length between 1 and 5 μm.

8. A photolithographic process according to claim 4, wherein the step of growing a plurality of carbon nanotubes comprises growing nanotubes with a length between 1 and 10 μm.

9. A photolithographic process according to claim 8, wherein the step of growing a plurality of carbon nanotubes comprises growing nanotubes with a length between 1 and 5 μm.

10. A photolithographic process according to claim 4, wherein the step of growing a plurality of carbon nanotubes is performed at a temperature of 100° C. to 400° C. for 20 to 70 sec.

11. A photolithographic process according to claim 10, wherein the step of coating comprises depositing by spin coating.

12. A photolithographic process according to claim 10, wherein the step of growing a plurality of carbon nanotubes is performed at a temperature of 150° C. to 200° C. for 20 to 70 sec.

13. A photolithographic process according to claim 12, wherein the step of growing a plurality of carbon nanotubes is performed at a temperature of 150° C. to 200° C. for 30 to 50 sec.

14. A photolithographic process according to claim 10, wherein the step of growing a plurality of carbon nanotubes is performed at a temperature of 100° C. to 400° C. for 30 to 50 sec.

15. A photolithographic process according to claim 4, wherein the carbon nanotubes extend substantially for the whole thickness of the composite layer.

16. A photolithographic process according to claim 1, wherein the step of forming a composite layer comprises preparing a suspension containing carbon nanotubes; uniformly dispersing the suspension in the photoresist; and coating the surface of the body with the dispersion so obtained.

17. A photolithographic process according to claim 1, further comprising the step of performing a thermal treatment after the step of forming a photosensitive layer.

18. A photolithographic process according to claim 1, wherein the step of selectively removing portions of the body comprises etching the body.

* * * * *

UNITED STATES PATENT AND TRADEMARK OFFICE
CERTIFICATE OF CORRECTION

PATENT NO. : 8,715,915 B2  
APPLICATION NO. : 13/047320  
DATED : May 6, 2014  
INVENTOR(S) : DavideGiuseppe Patti et al.

Page 1 of 1

It is certified that error appears in the above-identified patent and that said Letters Patent is hereby corrected as shown below:

\*\*In the Specification:

Column 1, line 64, the word "SLAB" in the sentence should be --SLAs--.\*\*

Signed and Sealed this
First Day of July, 2014

Michelle K. Lee
*Deputy Director of the United States Patent and Trademark Office*